(12) United States Patent
Devitt

(10) Patent No.: US 7,642,523 B1
(45) Date of Patent: Jan. 5, 2010

(54) VACUUM CHAMBER STAGE WITH APPLICATION OF VACUUM FROM BELOW

(75) Inventor: Andrew J. Devitt, Media, PA (US)

(73) Assignee: New Way Machine Components, Inc., Aston, PA (US)

( * ) Notice: Subject to any disclaimer, the term of this patent is extended or adjusted under 35 U.S.C. 154(b) by 300 days.

(21) Appl. No.: 11/797,364

(22) Filed: May 2, 2007

Related U.S. Application Data

(60) Provisional application No. 60/796,563, filed on May 2, 2006.

(51) Int. Cl.
| | |
|---|---|
| G01F 23/00 | (2006.01) |
| G21K 5/08 | (2006.01) |
| G21K 5/10 | (2006.01) |
| G01K 5/08 | (2006.01) |
| G01K 5/10 | (2006.01) |

(52) U.S. Cl. .............................. 250/441.11; 250/440.11; 250/442.11

(58) Field of Classification Search ............ 250/440.11, 250/441.11, 442.11; 269/21
See application file for complete search history.

(56) References Cited

U.S. PATENT DOCUMENTS

| | | | | |
|---|---|---|---|---|
| 4,229,655 | A | * | 10/1980 | Ryding ..................... 250/492.2 |
| 4,558,909 | A | * | 12/1985 | Stauber ........................ 384/12 |
| 4,726,689 | A | | 2/1988 | Pollock |
| 5,226,636 | A | * | 7/1993 | Nenadic et al. ................ 269/21 |
| 5,443,860 | A | * | 8/1995 | Wilkinson ............... 427/248.1 |
| 5,898,179 | A | | 4/1999 | Smick et al. |
| 5,997,963 | A | * | 12/1999 | Davison et al. ............. 427/582 |
| 6,443,618 | B1 | * | 9/2002 | Nishikawa et al. ............ 384/15 |
| 6,515,288 | B1 | | 2/2003 | Ryding et al. |
| 6,542,220 | B1 | * | 4/2003 | Schrijver et al. .............. 355/53 |
| 6,603,130 | B1 | * | 8/2003 | Bisschops et al. ...... 250/442.11 |
| 6,618,122 | B2 | * | 9/2003 | Bisschops et al. ............. 355/72 |
| 6,707,530 | B2 | * | 3/2004 | Schrijver et al. .............. 355/30 |
| 6,764,386 | B2 | * | 7/2004 | Uziel .......................... 451/39 |
| 6,774,374 | B1 | * | 8/2004 | Driessen et al. .......... 250/492.2 |
| 6,899,765 | B2 | * | 5/2005 | Krivts et al. ................. 118/728 |
| 7,232,286 | B2 | * | 6/2007 | Shinozaki ................... 414/805 |
| 7,394,076 | B2 | * | 7/2008 | Devitt .................... 250/442.11 |
| 2001/0027595 | A1 | * | 10/2001 | Saiki ......................... 29/25.01 |
| 2002/0021425 | A1 | * | 2/2002 | Janssen et al. ................ 355/53 |
| 2002/0180946 | A1 | * | 12/2002 | Bisschops et al. ............. 355/72 |

* cited by examiner

*Primary Examiner*—Jack I Berman
*Assistant Examiner*—Brooke Purinton
(74) *Attorney, Agent, or Firm*—Blank Rome LLP

(57) ABSTRACT

A stage for processing a substrate, especially useful for vacuum applications, has a recess just large enough to hold a substantially flat substrate and a chuck or holder, but not much more. The perimeter of both top and bottom of the stage has air bearing surfaces separated from the recess by differentially pumped grooves and seal lands. The air bearing lands are guided between two reference surfaces and the seal lands, being substantially coplanar, create a resistance to flow between the bearings and the recess. On the other side of one of the reference plates mounts the radiation source or process. The opposite reference plate may have a large aperture, non-contact pumping port. This improves vacuum capability and stage precision. The stage may operate in a vacuum environment itself or can provide multiple stages moving between processes or inspection steps within the same tool or process sequence.

20 Claims, 16 Drawing Sheets

VACUUM CHAMBER STAGE WITH APPLICATION OF VACUUM FROM BELOW

REFERENCE TO RELATED APPLICATIONS

The present application claims the benefit of U.S. Provisional Patent Application No. 60/796,563, filed May 2, 2006. Related information is disclosed in U.S. patent application Ser. No. 11/206,296, filed Aug. 18, 2005 (U.S. Patent Application Publication No. 2006/0060259 A1), currently pending. The disclosures of both of the above-captioned applications are hereby incorporated by reference in their entireties into the present disclosure.

FIELD OF THE INVENTION

This invention relates generally to equipment used in the manufacture of semiconductor devices and masks and more particularly to equipment used in vacuum processes. Applications are anticipated in areas including, but not limited to, ion implant and milling, deposition, etch, ash, clean, lithography, inspection and CD SEM.

BACKGROUND OF THE INVENTION AND DESCRIPTION OF RELATED ART

Because of the shrinking feature sizes in semiconductor wafers, greater degrees of precision are required in the stages used to provide the necessary motions. Because air-bearing stages allow for higher precision, they are commonly used to pattern and inspect semiconductor wafers. A point has been reached where optical techniques are limiting because of the width of the wavelength of light. Deep UV and even EUV processing will be required because of their shorter wavelength. The same or higher degree of precision is required in these processes, but they also require a vacuum environment. There are technical difficulties in attempting to use air-bearing stages in vacuum, as the escaping air increases the pressure in the vacuum chamber.

Many techniques have been employed to effect motion inside a vacuum chamber. Use of rolling element or plane bearing technology has been used but it is difficult to achieve the required precision. Air bearing systems with differentially pumped scavenge grooves have been employed inside a vacuum chamber. The difficulty here is that the stages quickly become very large to provide the required travels, necessitating large vacuum chambers, and because there is so much scavenging groove perimeter, it is difficult to achieve the low pressures required in the chamber. Another complicating factor in both these methods is that drives, encoders and services all have to be contained inside the vacuum chamber, causing problems with particulation and out gassing.

Methods to keep the mechanization outside of the vacuum chamber have been employed. These include linear and rotary contact seals, rotary ferro fluidic seals, expanding and contracting bellows. Also air bearings structures separated from the vacuum chamber by integral differentially pumped grooves that support some sort of a moving member through an aperture in the vacuum chamber wall. (Note U.S. Pat. No. 4,726,689 February 1988 Pollock, Varian; U.S. Pat. No. 5,898,179 April 1999 Smick, Applied Materials; U.S. Pat. No. 6,515,288 February 2003 Ryding, Applied Materials) have been tried and are the current state of the art in ion implantation. However, the above-noted problems with the prior art have not been successfully overcome.

The above-cited US 2006/0060259 A1 will be summarized. The disclosure in that application is somewhat similar to that of the present application and is summarized here for background information. Features of the devices and methods disclosed in the parent application can be incorporated into the present invention as appropriate.

FIG. 1a is a side view sectional schematic of a vacuum chamber stage 100 used for precision positioning of the semiconductor wafer or substrate 103 while the substrate is maintained in a vacuum chamber 117. The object of the apparatus is to expose the substrate to some sort of a manufacturing, processing or inspection for the purpose of manufacturing microelectronics circuits there on. Typically the substrate is exposed to some sort of radiation; examples of the many species of radiation would include but are not limited to Ions, x-rays, ultraviolet or extreme ultraviolet, electron beams, DUV (deep ultraviolet), extreme ultraviolet (soft x-rays) and visible light. Often this radiation needs to be conditioned by such devices as analyzers, magnets, mirrors or optics. This conditioning of radiation in this illustration is provided for in the area indicated by 119. This conditioning assembly is connected directly to the base reference member 104 with its output aperture 118 aligned with a consummate aperture 101 in the first reference plate 104.

Vacuum ports 225 for high vacuum conductance can be arrayed around the aperture 202 and connected on the opposite side of the base reference plate 206 to a manifold 203 connected to a cryopump or other low-pressure device. This arrangement allows for excellent conductance of pressure away from the area of interest. The ports may breakthrough into the wall of the aperture as in 102, or they may be completely through base reference plate 206 and arrayed around the aperture 202, as in FIG. 2a. Alternatively, or in addition, ports 102 could be used for directing radiation on an angle rather than normal to the surface of the substrate 103 with appropriate detectors arranged as needed, as for example is often the case in thin film measuring (ex. scatterometry and ellipsometry). The first reference plate 104 may be made from hard coated or nickel coated aluminum, nickel coated steel or stainless steel. Other materials such as ceramics or carbon fiber could also be considered. Important considerations are that the material be vacuum compatible, and the undersurface 106 may be made suitably flat to be used as an air bearing surface, and that the material have the structural strength to withstand the significant atmospheric pressures that may be applied to it without experiencing unaccepted distortions. The first reference plate 104 is shown as a simple plate for simplicity. It could easily be designed with structural ribs on the back; these ribs could also couple to additional mounting points for the radiation conditioning device providing a stiffer, firmer mount than the flange mount shown for simplicity. Avoiding distortions from atmospheric pressures is not a trivial issue; thousands of pounds of force will be equally distributed across a face of the vacuum chamber which will move around on the base reference plate. It is important that the reference base plate 104 remain flat because the smaller the air gap that can be used in the air bearing without contact the more efficient the lands between the differentially pumped grooves become. Engineering techniques for calculating and modeling these forces, including finite element analysis, are well-known in the art and need not be repeated here.

The vacuum chamber stage 114 with air bearing 115 and differentially vacuum pumped grooves 116 is urged against the lower surface 106 of the first reference plate 104 by thousands of pounds of atmospheric pressure. As air bearing surfaces 115 on the vacuum chamber stage 114 come within a thousandth of an inch of the reference base plate surface 106, pressure builds up in the gap 156 between them until equilibrium is reached. The stage then rides on this pressurized film of air, using atmospheric pressure as a preload force to create a very stiff, well damped air bearing free to translate in X, Y and theta. As with the first reference base plate 104, it is important that the vacuum chamber stage 114 have the requisite stiffness not to deform from the thousands of pounds of atmospheric pressure urging it toward the reference plate 104. The air bearing surface 115 in this preferred embodiment employs porous media compensation. Other air bearing compensation may be employed including but not limited to orifice and step compensation. Air bearings are a widely accepted art, much has been written about orifice and porous type air bearings, for porous media air bearings (see FIG. 1b). Porous media air bearings are most commonly made from porous carbon or graphite but may be made from porous alumina or silicon carbide. Carbon and graphite have excellent crash resistance and are very tolerant of inadvertent bearing face contact. Differentially pumped grooves are also well known in the art and are illustrated in FIG. 1b. Notice that in this preferred embodiment the grooves get wider and deeper progressively with lower air pressures. This is consistent with minimizing restriction and maximizing conductance of pressure away from the air bearing land areas.

This embodiment can be arranged so as to make it relatively simple to get a wafer 103 in and out of the vacuum chamber stage 114. A 25 mm×325 mm aperture 105 can be arranged in the side of a vacuum chamber stage 114, the vacuum chamber stage 114 can be physically docked against the load-unload station 107 see FIGS. 1c and 2c for the passing of wafers 103 in and out of the chamber without the introduction of atmospheric pressure to the chamber. Commercially available, but not shown, vacuum gates will be required.

By allowing for X and Y motions in a single plane it becomes convenient to use reference mirrors in the plane of the wafer and to drive the vacuum chamber stage through its center of mass. It is also possible to use reaction masses and service stages to improve the stage performance.

It is not necessary but it would be wise to provide another mechanism to urge the vacuum chamber stage 114 against the first reference plate 104. In the event that the vacuum chamber stage 114 loses the vacuum in the chamber 117, gravity would separate the vacuum chamber stage 114 from the first reference plate 106. This would result in a temporary unrecoverable situation. To avoid this situation, air bearings 111 acting upon a second reference plate or base 110 can be employed to urge the vacuum chamber stage 114 against the first reference plate 104 through a constant force springs mechanism 112.

The chuck 109 may be an electrostatic chuck or another chuck technology appropriate for vacuum. The chuck 109 may be mounted on a Z actuator or lifter mechanism 108 for the purpose of raising or lowering the substrate 103 in the VCS, for instance to facilitate substrate changes or to achieve a depth of field adjustment or fine planerization of the substrate. Many techniques known in the art are possible including piezos, super Z's, flexures or other mechanical lifters.

FIG. 2a shows a side view sectional view of a second preferred embodiment. This embodiment allows for the VCS 210 to contain an isolated vacuum chamber 223 as before but also operate in a vacuum 207. This can be a important feature minimizing problems which could occur regarding water vapor adhering to the first 222 or second 216 reference surfaces while the VCS is not over that area. This is accomplished by repeating the air bearing 214 and differentially pumped grooves 211 on the underside of the vacuum chamber stage 210. This is essentially two opposed mirror images.

A radiation source 201 can have a high conductance manifold 203 arrayed around the interface with the base reference plate 206. This manifold is attached to a vacuum pump via large aperture tube 204. Ports 225 through the first reference plate 206 surround the area of interest for good conduction, but are not necessary in all applications. The annular air bearing 214 is separated from the vacuum chamber 223 by differentially pumped grooves and seal lands 211 which are serviced by tubes from the motion system. This pattern is repeated exactly on the opposite side of the vacuum chamber stage 210. This second set of air bearing lands and differentially pumped grooves bear on surface 216 which is the top of the second reference plate 209. The opportunity exists to make the air bearing land area 214 smaller because in this embodiment the opposite pressures in the air bearing lands, grooves and chamber are exactly equal due to the fact that they are ported through common connections 217, 218, 220 and 221 to their source through 250, 251, 252 and 253. The pressurized air gaps 215 are preloaded against each other only. The air bearing 214 running on the second reference base 209 will be carrying the gravity load of the vacuum chamber stage 210 which would likely be 20 lbs. plus or minus an order of magnitude. The preload force between the bearings can easily be 10 times (one order of magnitude more than this gravity force), making the gravity force inconsequential. This allows the VCS to operate in a vacuum with the lowest pressure inside the VCS and isolated from contamination or pressure.

FIGS. 3a and 3b are sectional views of an X and Y vacuum chamber stage with rotation, and a differentially pumped port for transfer of the wafers or substrates and or high conductance pumping port, as in a third preferred embodiment.

Some applications, like thin film characterization, often employ rotation of the wafer. The embodiment of FIGS. 3a and 3b provides for rotation inside of an XY stage. By employing annular 360 degree radial air bearing surfaces isolated from the pass though by 360 degree radial differential pumped grooves and lands. As the XY stage is moved about, the radial bearings keep the rotating part centered. The XY stage carries a rotary actuator to spin the rotation part of the stage; it is possible to add an encoder. It is possible with differentially pumped grooves on outside of these bearings to operate the whole assembly in a vacuum environment. It will be necessary to vent the volume that the upper and lower 3 bearing set commonly leak into, it will also be necessary to vent the area under the rotating member to avoid pressure build up. An area 314 is provided for the motor and the encoder.

FIG. 4a, b, c show a device and method for ion implantation of substrates such a semiconductor wafers as in a fourth preferred embodiment. Ion implantation has moved from batch processing to serial processing. Serial processing provides more flexibility in the recipe that is administered to each wafer and more flexibility in the attitude of the wafer to the ion radiation, being able to pitch and rotate the wafer so as to dope or expose the sides of the via and the trenches equally. In order to keep throughput high, makers of ion implantation equipment have been migrating from spot or point beams that were scanned across the wafer in batch process to "ribbon" type beams. Ribbon type beams are slightly wider than the substrate or wafer being processed. The substrate may then be passed through the ribbon beam, exposing the whole substrate surface to the radiation. The beam may be a thin ribbon; 0.25 in, or a thick ribbon; 4 in. The thickness of the ribbon beam has an effect on the required travel of the wafer, which must pass though the entire ribbon before reversal.

FIG. 4a represents the preferred embodiment of the vacuum chamber stage device and method for modern ion implantation. The beam 409 in this case comes from below with the first reference plate 405 and vacuum chamber stage 403 nominally horizontal, although this could easily be reversed or at 45 degrees. The vacuum chamber stage 403, as in previous embodiments is urged against the opposite side 413 of the first reference plate 405 from the radiation source by atmospheric pressure The vacuum chamber stage 403 is actuated by a motion system 417 outside of the vacuum area 402. The guidance for the motion system 418 could be from air bearings or rolling element bearings. In ion implantation motion characteristics are not as critical as in other precision applications and roller bearings would be an appropriate choice. The connection between the vacuum chamber stage 403 and the motion system 417 and actuators 418 could be with a blade flexure 450 which would decouple the vacuum chamber stage 403 from the drive and guide system in the Z direction which is constrained by the air bearing and atmospheric pressure against the vacuum chamber stage as in FIG. 4c. In this embodiment is not necessary to run vacuum services to the vacuum chamber stage 403. Because the motion on the vacuum chamber stage is linear only with respect to the base reference plate 405, holes or ports 415 through the first reference plate which aligned to the grooves 411 can be used to conduct pressure out of the grooves 411. Holes or ports 414 through the first reference plate 405 may also be used to conduct pressure from the chamber directly around the area of interest. These holes may be on an angle to clear the beam 409 during tilting. The chuck 406 holding the substrate or wafer 407 is mounted to a rotary actuator 401 through a Ferro fluidic, mechanical contact seal or air bearing with differentially pumped grooves. Continuous rotation is not required in this embodiment, only the ability to index 90 or 180 degrees, 90° in order to be able to get all the orthogonal groves and trenches, and 180 degrees in order to avoid tilting the plate in both directions as shown in FIG. 4b. Notice the whole reference plate may be tilted with respect to the Ion or radiation source. This tilting action, combined with a rotary motion allows complete coverage of all surfaces on the substrate including the sides of the via and trenches. This embodiment also allows for constant focus or distance from the Ion or radiation source providing the most uniform doping of the substrate.

Still further embodiments are possible, as will be described with reference to FIGS. 5a-5c. FIG. 5a shows two VCS's on reference members on opposite sides of a cylindrical member. One stage is a long travel and the other, a short travel high speed stage. FIG. 5b shows a VCS on a reference member incorporating components for writing and measuring a workpiece. FIG. 5c shows two VCS's on opposite sides of an opening in a single reference member.

SUMMARY OF THE INVENTION

It is therefore an object of the invention to improve deep vacuum performance and stage precision.

To achieve the above and other objects, an important design feature in this invention is that instead of trying to build a stage inside a vacuum chamber or reach through a chamber wall, the stage itself becomes the vacuum chamber. Such a stage is called a vacuum chamber stage (VCS). By having the primary or only vacuum chamber completely contained inside the moving stage, all motion systems can exist outside of the vacuum. Because the vacuum chamber size is reduced to little more than the volume of the substrate, the vacuum pumping requirements and pump down times are dramatically reduced, and the requirement for a large conventional vacuum chamber is eliminated. At the same time, the structural loop between the source and the substrate, say a wafer, is dramatically shortened and stiffened.

The stage is guided between two reference surfaces, one of which is the underside of the base reference member to which the optics, ion source or electron source would mount. Guidance of the stage in the plane established between the surfaces in X and Y is achieved with annular air bearings separated from the vacuum section of the stage by differentially pumped grooves on both sides of the stage. This type of stage would be very appropriate for electron beam writing or inspection, Deep UV lithography or ion implantation. This stage architecture may also be useful for many non-vacuum processes because of improvements in the structural loop.

This embodiment includes an additional novelty which provides for conductance of air pressure or molecules away from the substrate or the possibility to process both sides of the wafer at one time by providing thru a hole in the base reference member opposite the area of interest. We believe that first embodiment described in the above-cited US 2006/0060259 A1 can realize $10^{-7}$ torr with vacuum services coupled to the vacuum chamber stage via tubes carried by or integrated into the motion system that is driving the stage. The present embodiment is a way to more easily create lower pressure in the vacuum chamber stage. Because very low pressure requires large aperture conductance it can be inconvenient to attach such large tubes to the vacuum chamber stage directly. The following non-contact methods allow improvements in vacuum and precision.

BRIEF DESCRIPTION OF THE DRAWINGS

Preferred embodiments of the present invention will be disclosed in detail with reference to the drawings, in which.

DETAILED DESCRIPTION OF THE PREFERRED EMBODIMENTS

Figure 1A:
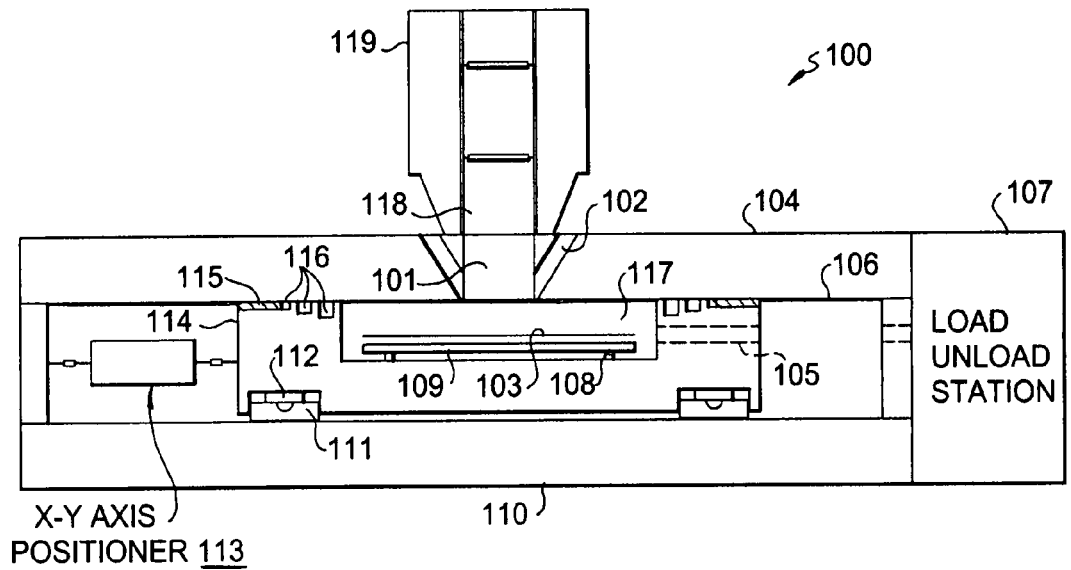
FIGS. 1a-1c show a first embodiment disclosed in the above-cited parent application.
Figure 1B:
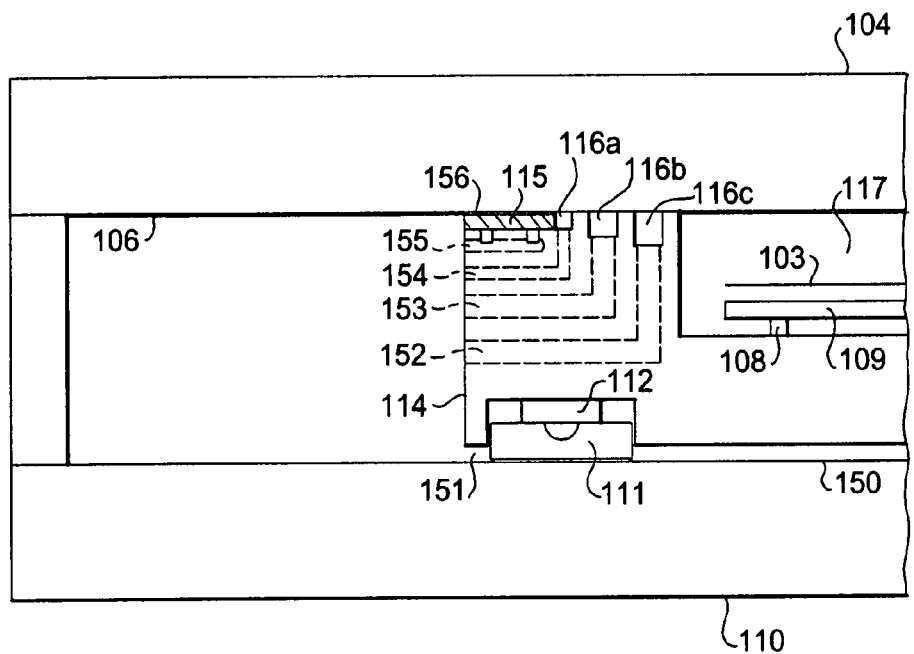
Figure 1C:
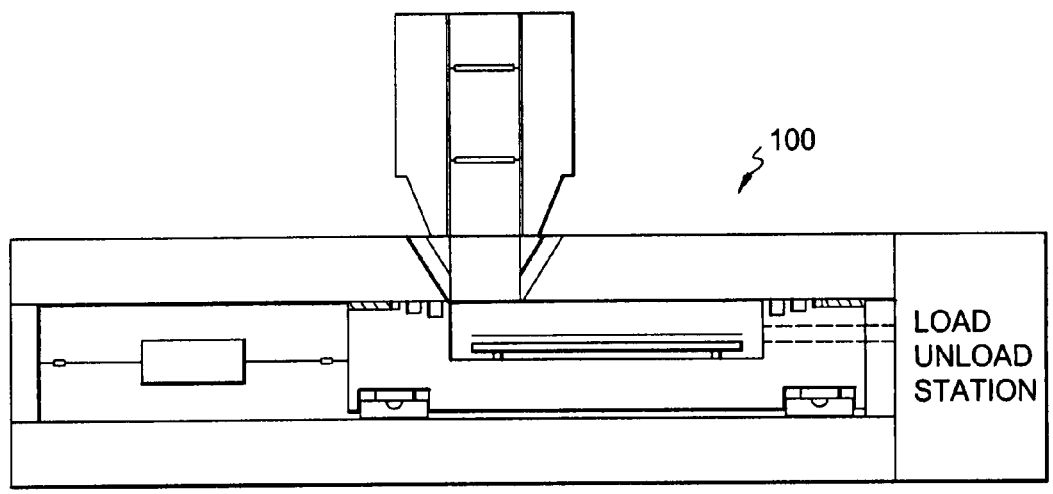
Figure 5C:
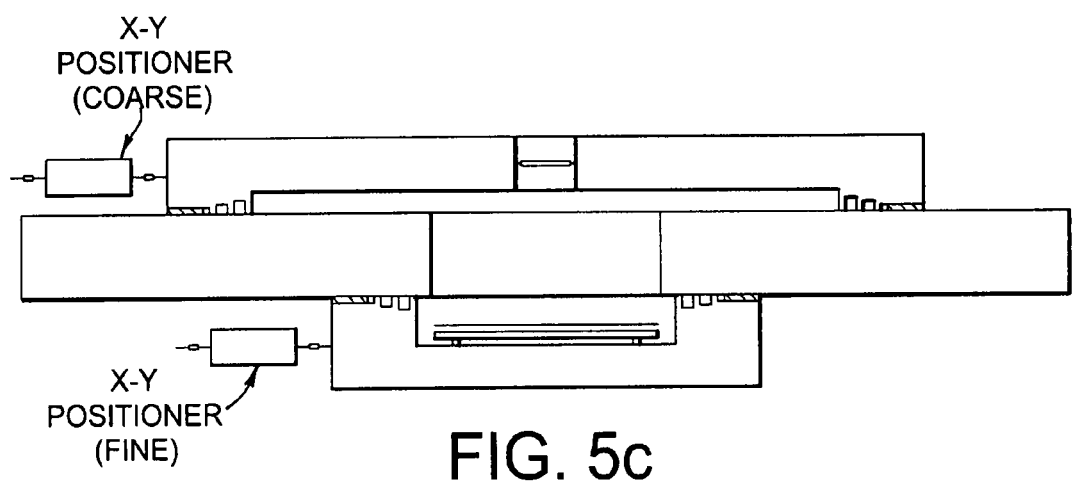
FIGS. 5a-5c show other embodiments disclosed in the above-cited parent application.
Figure 2A:
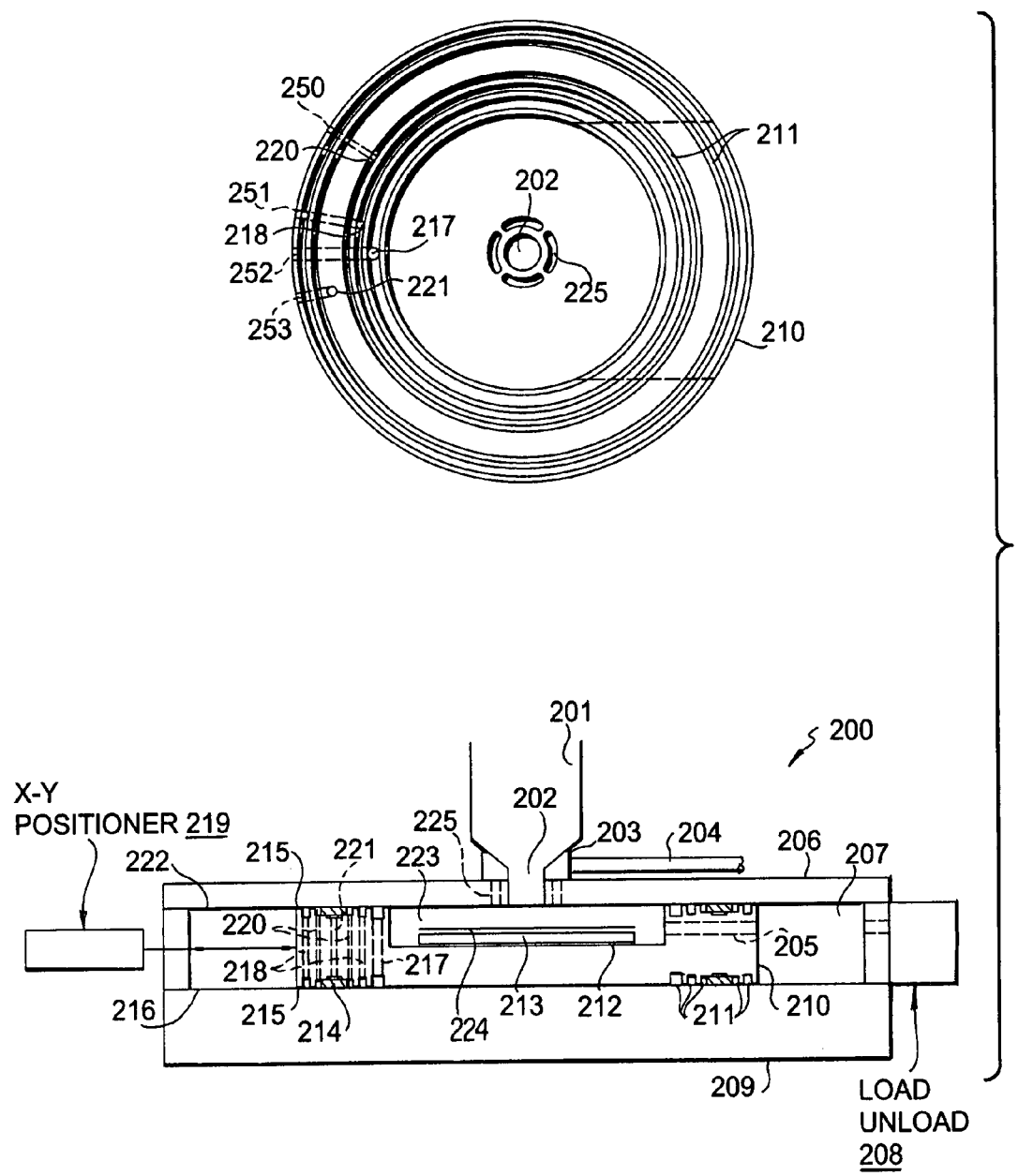
FIG. 2a shows a second embodiment disclosed in the above-cited parent application.
Figure 3A:
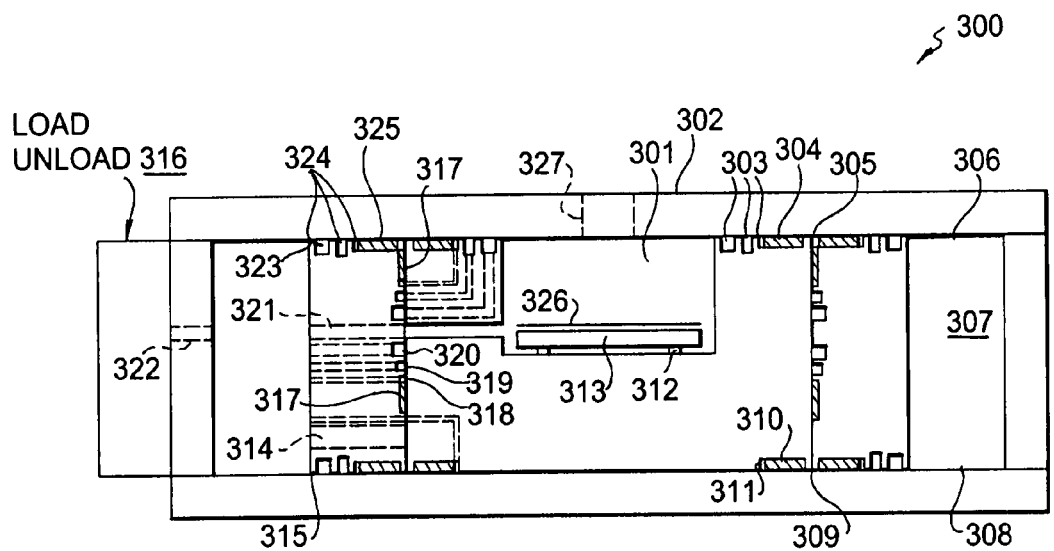
FIGS. 3a and 3b show a third embodiment disclosed in the above-cited parent application.
Figure 3B:
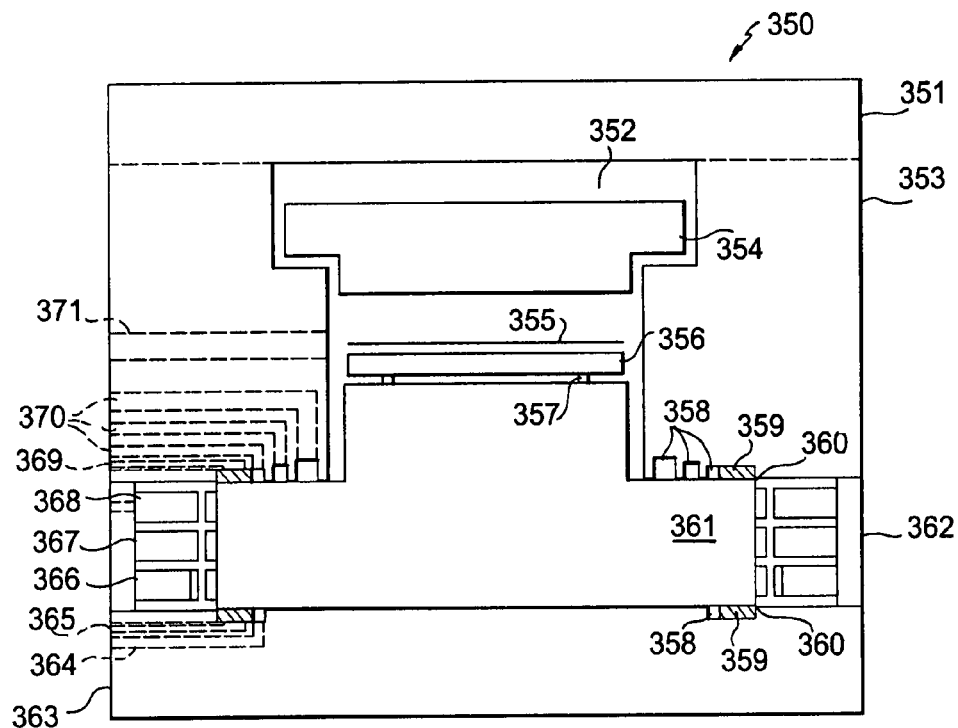
Figure 4A:
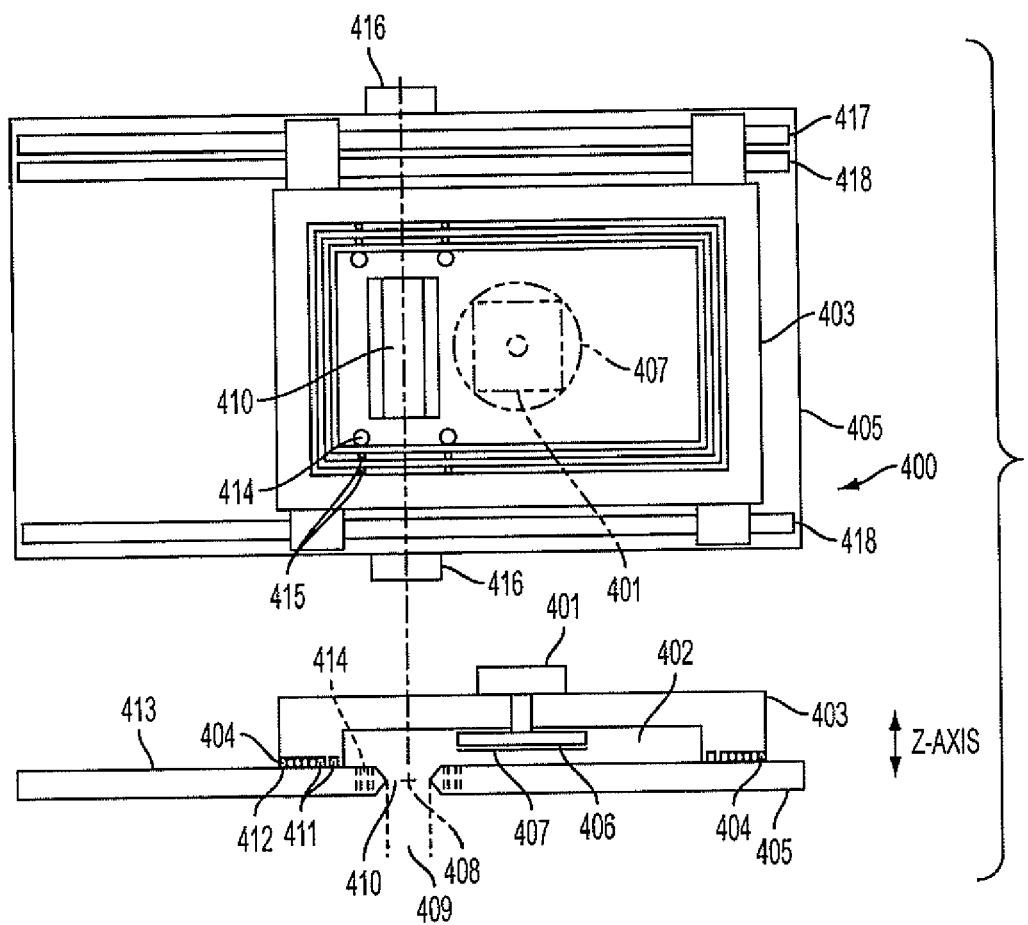
FIGS. 4a-4c show a fourth embodiment disclosed in the above-cited parent application.
Figure 4B:
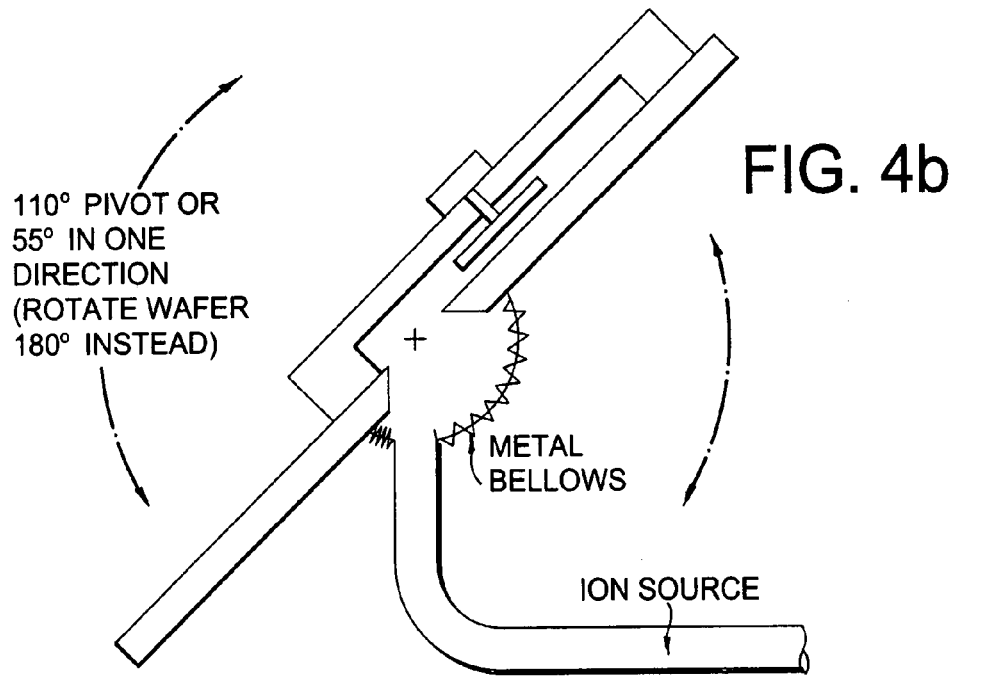
Figure 4C:
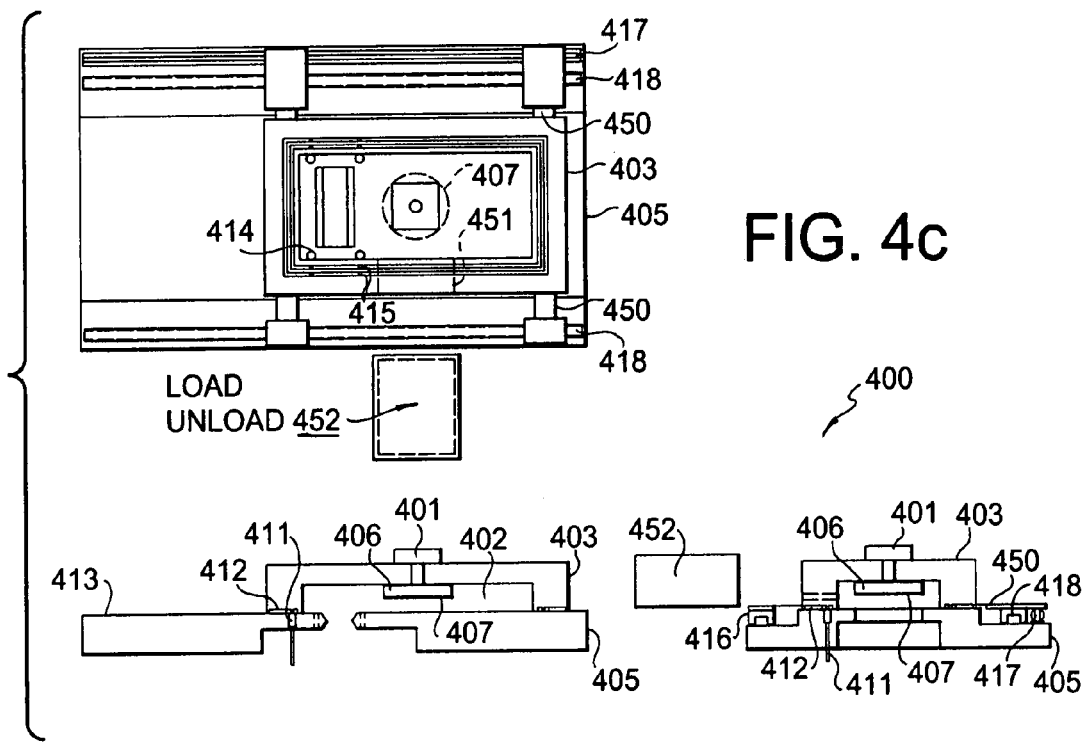
Figure 5A:
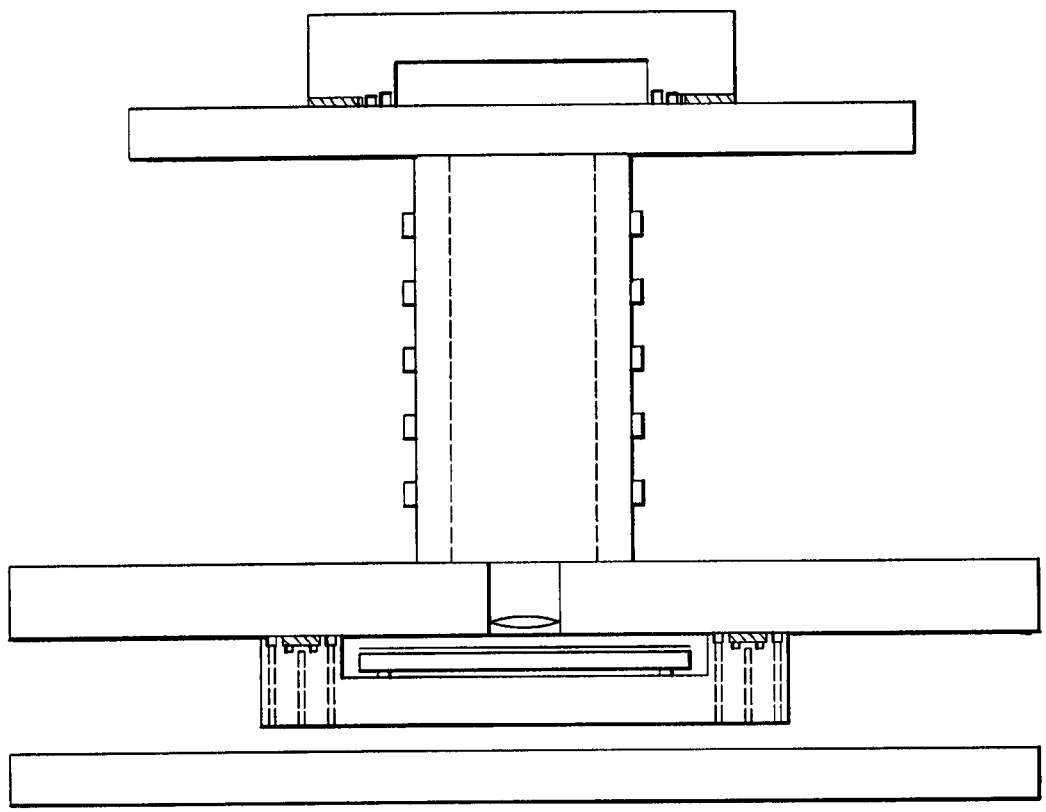
Figure 5B:
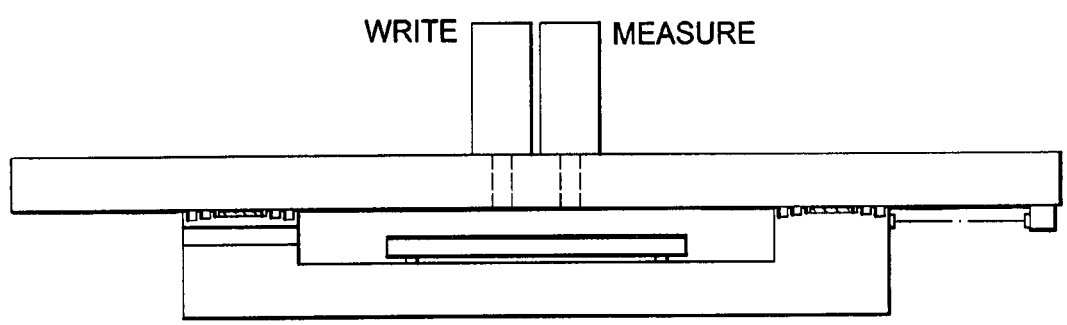

Preferred embodiments of the present invention will now be set forth in detail with reference to the drawings, in which like reference numerals refer to like elements or steps throughout.

Pump from Below without Outside Vacuum

Figure 6:
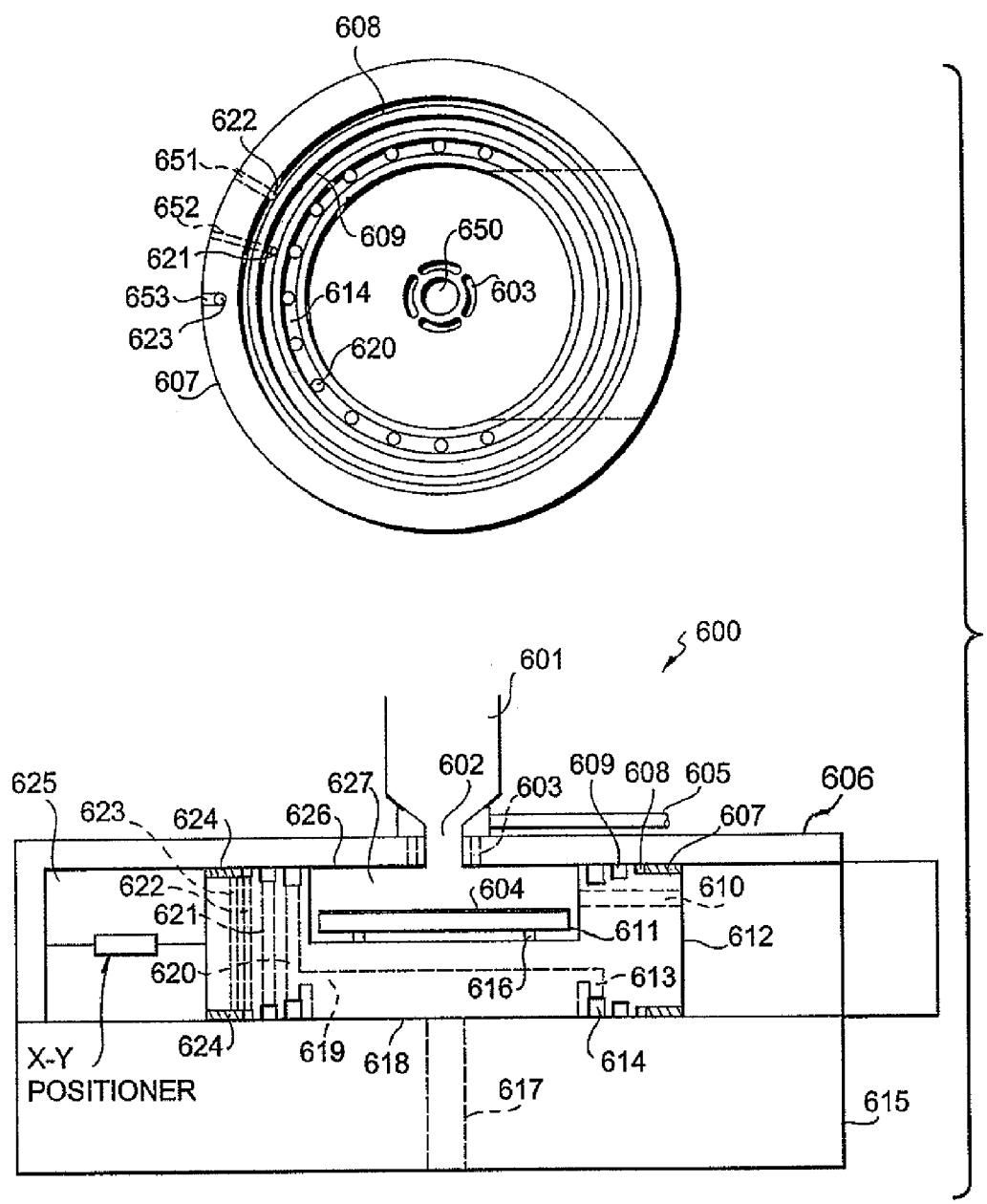
FIG. 6 shows a first preferred embodiment of the present invention.

This embodiment is shown in FIG. 6. This novelty allows large aperture conductance 617 to be ported into the vacuum chamber stage 612 though the sub base plate 615 without any physical contact. This is accomplished by repeating the air bearing 607 and differentially pumped grooves 608, 609, 614 on the underside of the vacuum chamber stage 612. This is essentially two opposed mirror images. This large aperture 617 though the sub base plate 615 can then be ported in to the last differentially pumped groove 614 or into the chamber 627 directly. This dramatically improves vacuum conductance in the chamber and improves stage motion performance by minimizing the vacuum tube size. The stage no longer sees the atmospheric pressure so the air bearing lands may be smaller and the stage is subject to less physical distortion.

A radiation or other process source 601 can have a high conductance manifold 602 arrayed around the interface with the base reference plate 606. This manifold is attached to a vacuum pump via large aperture tube 605. Ports 603 through the base reference plate 606 surround the area of interest for good conduction but are not necessary in all applications. The annular air bearing 607 is separated from the vacuum chamber 627 by differentially pumped grooves 608, 609, 614 which are serviced by tubes from the motion system. This pattern is repeated exactly on the opposite side of the vacuum chamber stage. This second set of air bearing lands and differentially pumped grooves bear on surface 618 which is the top of the sub base 615. The opportunity exists to make the air Bearing land area smaller because in this embodiment the various pressures in the air bearing lands, grooves and chamber are exactly equal due to the fact that they are ported through common connections 620, 621, 622, 623 to their source through 651, 652, 653 though the stage 612 and 617 though the sub base plate 615. The pressurized air gaps 624 are preloaded against each other only. The air bearing running on this sub base 615 will be carrying the gravity load of the vacuum chamber stage 612 which could be 20 lbs. plus or minus an order of magnitude give or take. The preload force between the bearings can easily be 10 times (one order of magnitude) more than this gravity force, making the gravity force inconsequential. In this embodiment it is necessary to have a functioning vacuum gate on the stage 612 that closes the load unload aperture 610 and so maintains vacuum in the stage 612 by separating the internal chamber 626 from the larger chamber outside the stage 625 that in this case is at ambient pressure. Piezo actuators 616 may be used for substrate 604 planarization and fine 'Z' axis motion.

The preferred embodiment employs porous air bearing technology. Other air bearing compensation may be employed including, but not limited to, orifice and step compensation. Air bearings are a widely accepted art. Much has been written about orifice and porous type air bearings. Porous media air bearings are most commonly made from porous carbon or graphite but may be made from porous alumina or silicon carbide. Carbon and graphite have excellent crash resistance and are very tolerant to inadvertent bearing face contact.

In the preferred embodiment, it is recommended to drive on the center of mass and measure on the plane of the wafer. The use of reaction masses is anticipated for optimum stage control.

Pump from Below with Outside Vacuum

Figure 7A:
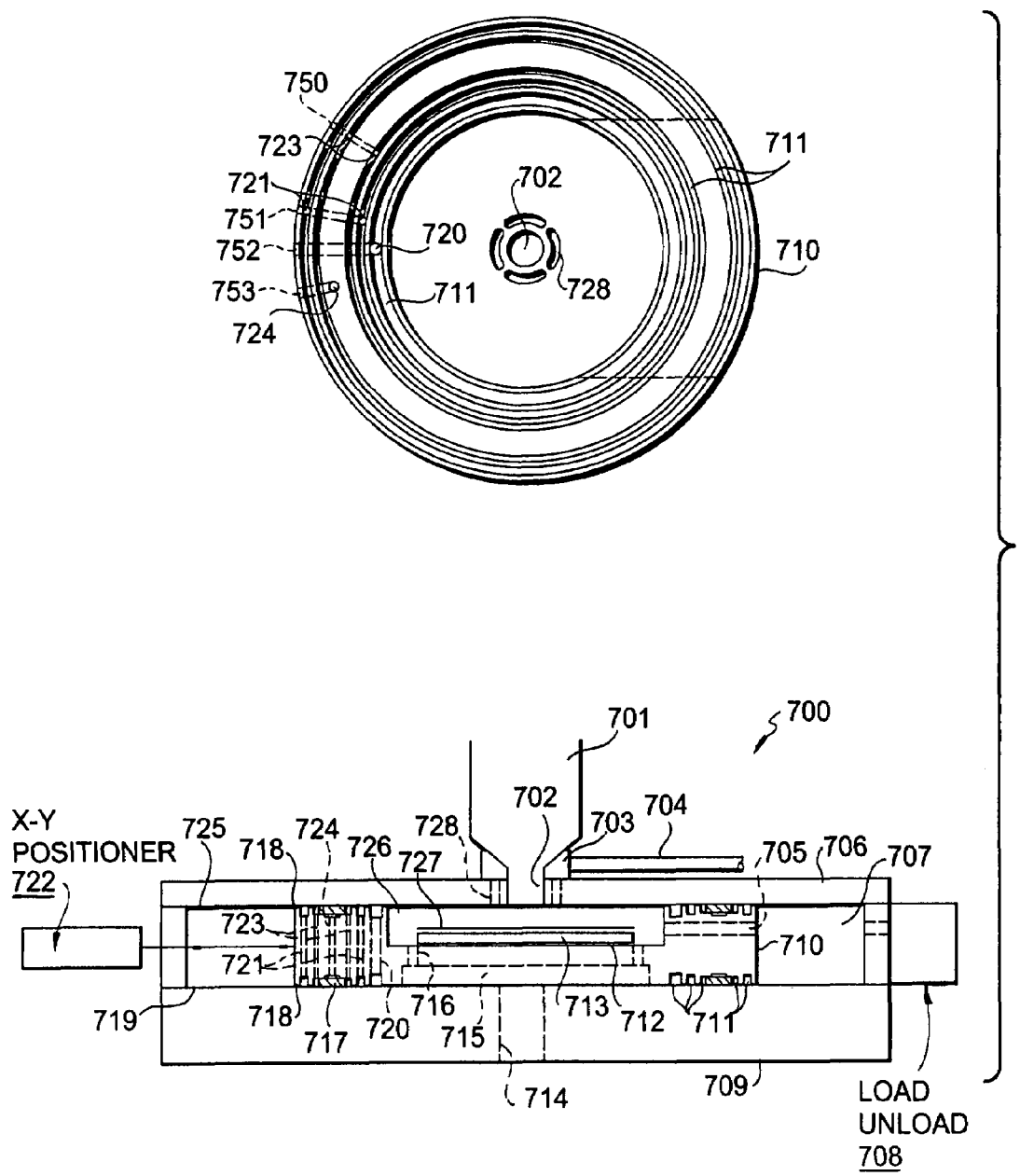
FIGS. 7A-7D show a second preferred embodiment of the present invention.

This embodiment is shown in FIG. 7A. In another preferred embodiment, it is advantageous to have the stage 710 operate in a vacuum environment 707. To do so, differentially pumped grooves 711 can also be arrayed on the outside perimeter of the air bearing 717. Operating the stage 710 in a controlled chamber 707 avoids adhesion of water vapor or air molecules to the base reference plate 706 or sub base 709 bearing surfaces 725, 719. It would still be necessary to employ a gate between the load and unload aperture 705 and volume 707 although if volume 707 is pumped to molecular flow regime a gate will not need to be as expensive. The invention, including the various preferred embodiments, can be used in the fluid regime or the molecular regime; therefore, concepts such as conductance should be understood as encompassing either regime as appropriate.

Figure 7B:
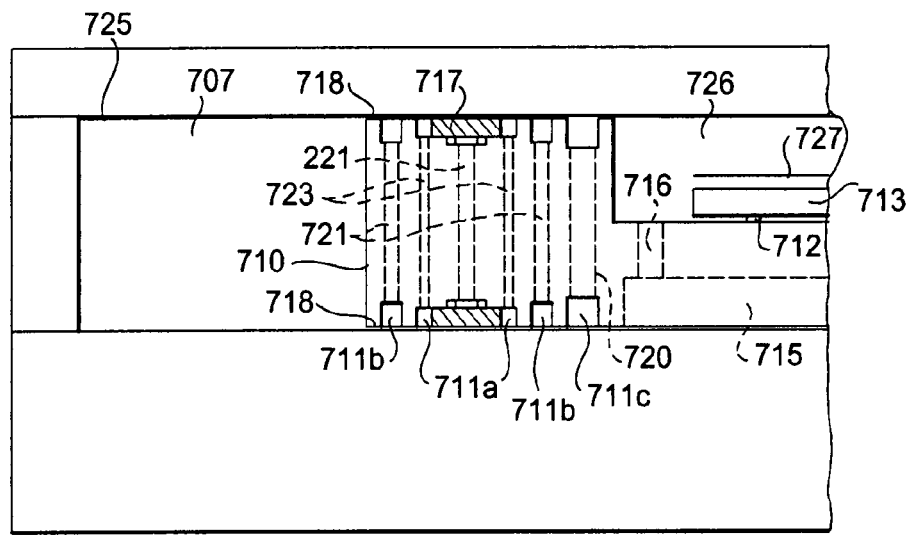

FIG. 7B is a more detailed image of the bearing and land areas. 711a represents the first set of ambient or pumped grooves. The four grooves 711a may be ported together and pumped through a single fitting on the outside of the stage 710. The second set of pumped grooves 711b may also be ported through a single fitting on the outside of the stage 710 although the fitting may need to be larger for better conductance. The third grooves 711c may be necessary as extra insulation of the process area may be required. Because most embodiments do not have a requirement for as low a pressure in volume 707 as there is in volume 726, it may not be necessary to have a third groove on the outside of the stage and is not shown there.

Figure 7C:
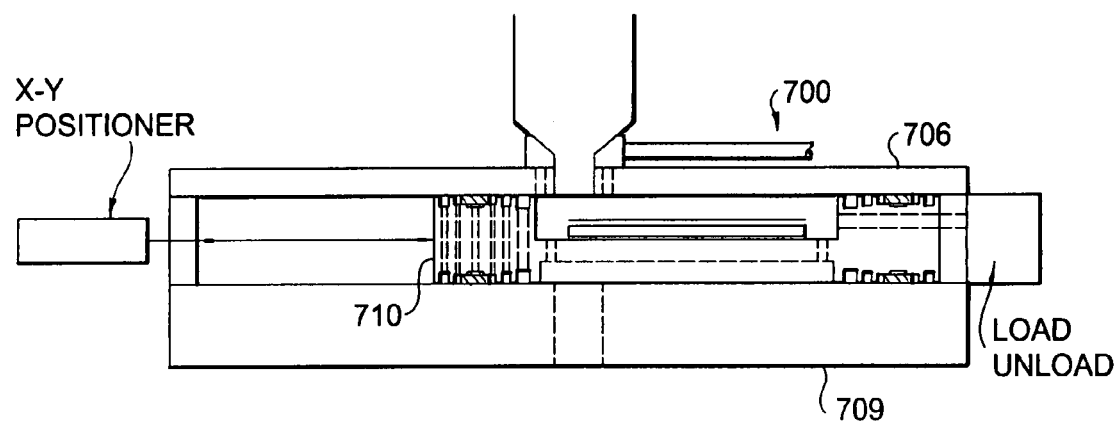

In FIG. 7C, notice the relative motion between the vacuum chamber stage 710 and the base reference member 706 and sub-base 709 in FIGS. 7A and 7C.

Figure 7D:
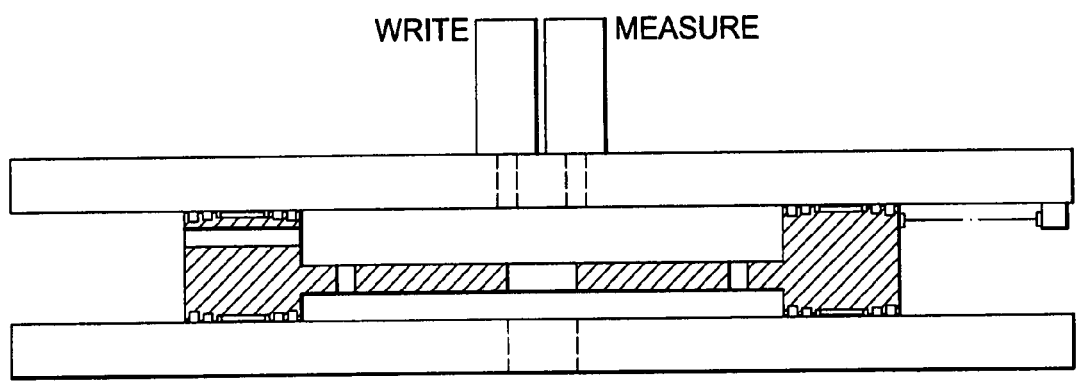

FIG. 7D is an illustration of how an embodiment may combine functions in a single stage system with the high conductance pumping from below. Also this is an illustration of the use of three differentially pumped grooves on the inside and the outside of the air bearing lands. By having the stage operate within a vacuum, interferometric position feedback is improved.

Figure 8A:
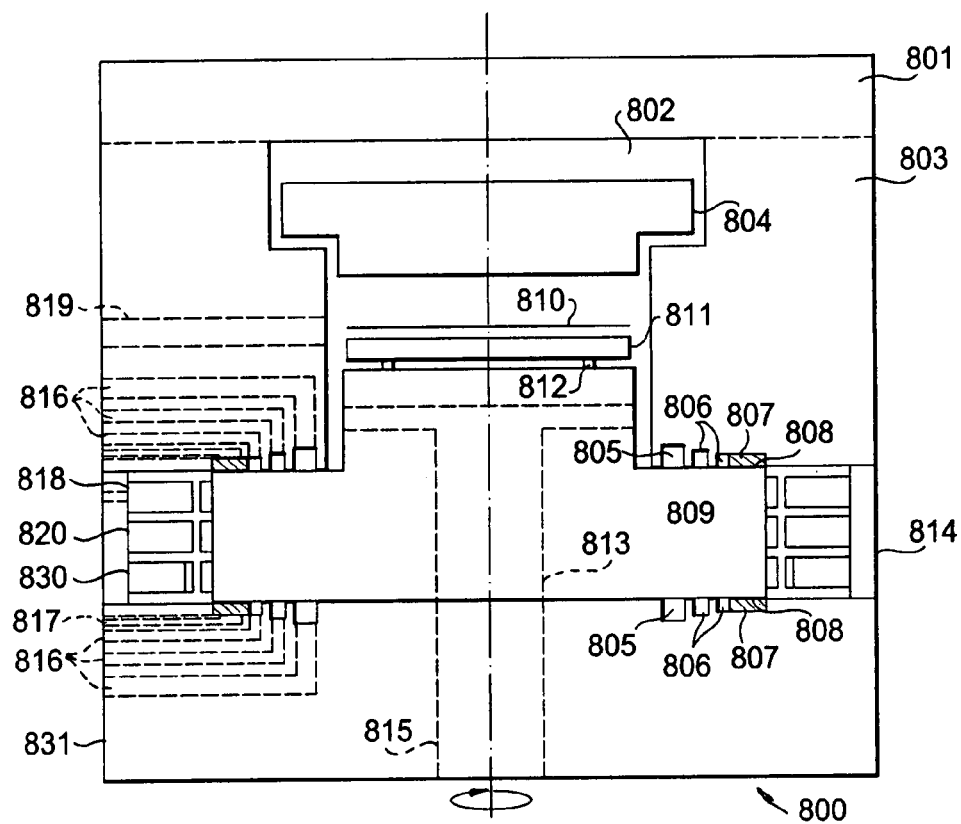
FIGS. 8A-8C show a third preferred embodiment of the present invention.

FIG. 8A shows a device for providing precision rotation in a vacuum environment, drawn in the preferred embodiment for very low pressure. A sub plate with high conductance pumping aperture 815 through to the bottom of the vacuum chamber stage 813 as disclosed in FIG. 6 could also be employed here for rotary motion. Notice that in this embodiment, the bearing and lands are stationary. The device has a cap or lid 801 that may be on hinges as used commonly on deposition chambers. The cap 801 mounts on and seals on a stationary vessel 803 which contains the upper stationary part of the vacuum chamber. In this embodiment a target 804 or source for a deposition process is shown. This arrangement of the vacuum chamber stage allows for other embodiments including an X or an XY vacuum chamber stage with air bearing and differentially pumped grooves replacing the cap 801 and target 804. The vessel 803 has been designed and manufactured to provide for an air bearing 807 and differentially pumped grooves 805, 806. These features are shown on the vacuum chamber stage itself in most examples but, in this embodiment, the vacuum chamber stage 809 does not move in X and Y, only in rotation and so it more convenient to plumb vacuum connections through the stationary members. Notice that this embodiment employs the high conductance technique disclosed in FIG. 6. This may not be necessary because of the convenience of mounting vacuum conductance to stationary structures. The vacuum chamber stage 809 is supported and guided in Z on the air bearing films 808. In this case the load on the stage 809 from the atmosphere is in perfect balance because the vacuum chamber 802, differentially pumped grooves 805, 806 and air bearings 807 are in symmetry. This reduces the load and so the size of the required air bearing surface.

Figure 8B:
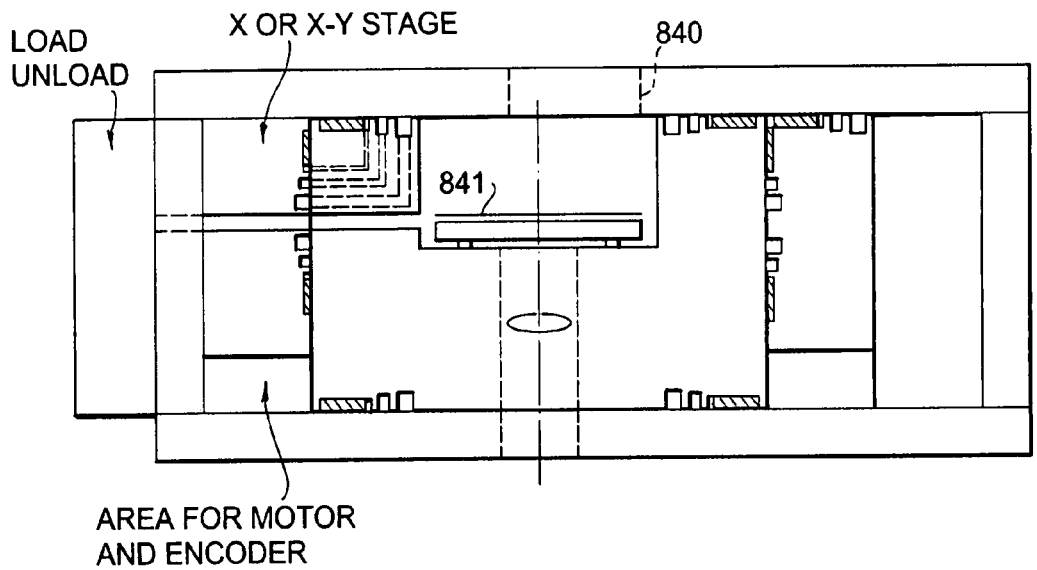

As seen in FIG. 8B, a slot 840 providing access to the substrate 841 radially, which because of rotation allows for access to the entire surface either by a point source or detector on a linear stage transiting the radius or by a wide beam that covers the entire radius. The translation stage is not shown. In another embodiment, the thrust bearings could be integrated into the stationary members as shown in FIG. 8A.

Figure 8C:
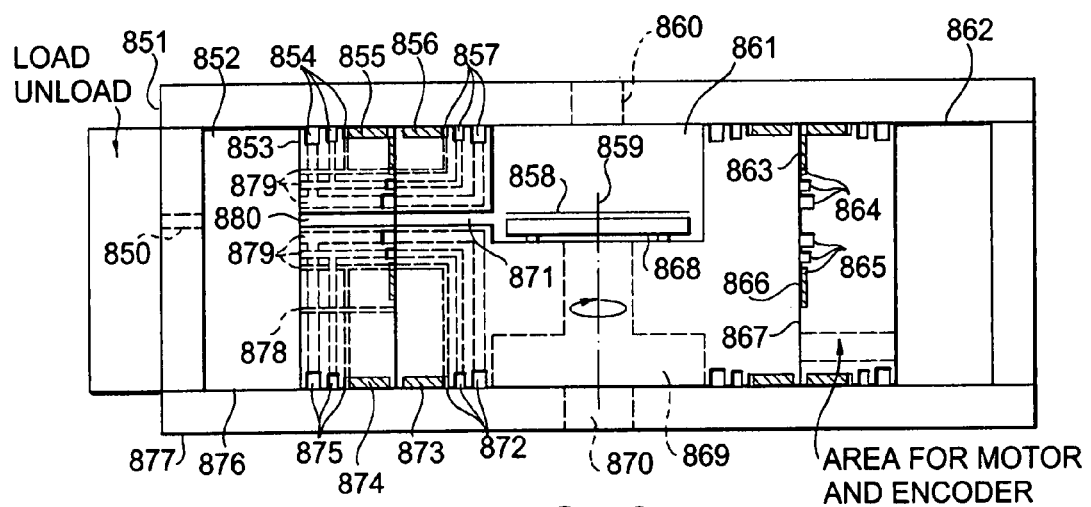

FIG. 8C shows a side sectional view of an XY vacuum chamber stage 853 with rotation about the centerline 859 and a port 871 surrounded by differentially pumped grooves 864, 865 and lands for transfer of the wafers 858 or substrates and or as a high conductance pumping port. This port 871 is arranged so that it aligns with a consument port 880 though the XY stage 853.

Some applications, like thin film characterization, often employ rotation of the wafer 858. FIG. 8C provides for rotation inside of an XY stage 853. By employing annular 360 degree radial air bearing surfaces 863, 866 isolated from the pass through by 360 degree radial differential pumped grooves 864, 865 and lands. As the XY stage 853 is moved about the radial bearings 863, 866 keep the rotating part 867 centered within the XY stage 853. The XY stage 853 carries a rotary actuator to spin the rotation part of the stage. It is possible to add an encoder. It is possible with differentially pumped grooves 854, 875 on outside of these bearings 855, 874 to operate the whole assembly in a vacuum environment. It will be necessary to vent 878 the volume that the upper and lower bearing sets 855,856,863,873,874 commonly leak into. The venting for the upper set of bearings is not shown in this figure.

Figure 9A:
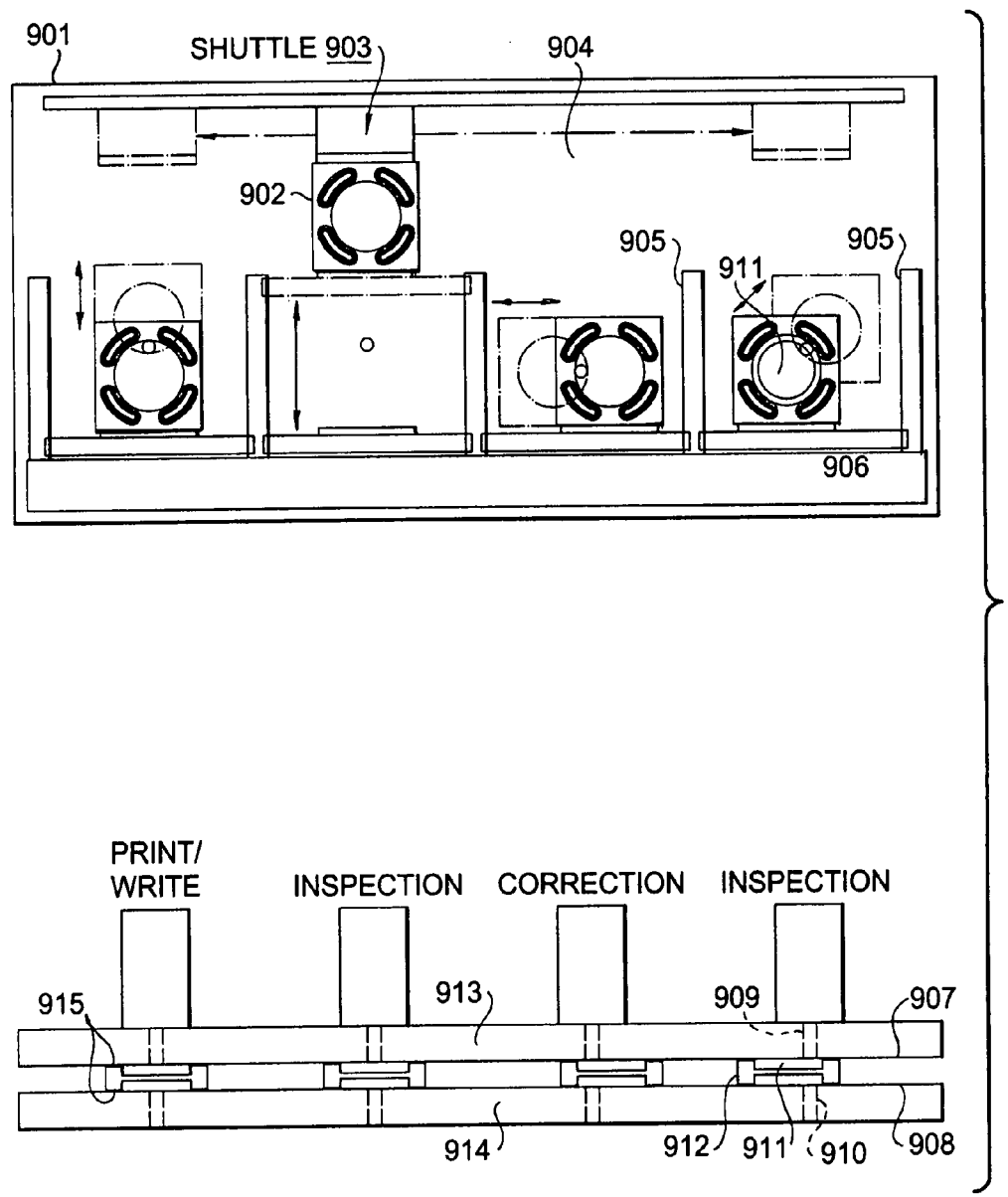
FIGS. 9A-9C show a fourth preferred embodiment of the present invention.

As seen in FIG. 9A, it is envisioned that the advantages of the foregoing embodiments could be individually or in combination applied in a larger motion system 901 with stages 902 that could be shuttled between process areas. For example, machine throughput could be increased and or the substrate could be referenced to the stage body (ex. Inferometric reference mirrors) and specific inspection or correction areas of interest located quickly.

In one preferred embodiment, there is a larger vacuum volume 904 in which the stages 902 operate and a much smaller vacuum volume 911 containing the substrate that can be quickly pumped to deeper vacuum by the high conductance aperture 910 from below. The volume 904 could be pumped to the molecular flow regime and or be nitrogen rich to avoid moisture on the reference surfaces 907, 908. Once in the molecular flow regime, the small gap 915 that exists between the reference surface 907 and the bearing face 927, lands 926, differentially pumped grooves 928 and the clearance surface 925 becomes an effective seal between the larger volume 904 and the smaller volumes 911. The small gap 915 is substantially the same as the air bearing gap as it will be convenient to face, machine or otherwise planerize surfaces 925, 926, 927 in the same operation.

In order to facilitate the shuttling of the vacuum stages 902 between different process areas, it is desirous to avoid the air bearing lands 927 translating over the process aperture 909 or the high conductance pumping aperture 910 below. In order to avoid this, the air bearing lands 927 may be segmented and sealed with the differentially pumped grooves 928 and lands 926 completely surrounding them.

One potential embodiment of a quad scan motion system could employ dual Y-axis drives 905 and a single X-axis drive 906. This type of stage actuator is common in the art of single plane XY air bearing systems for ambient pressures and would allow for driving on the center of mass and measuring on the plane of the wafer. A wall down the center 905 gives structural column support to the base reference member 913 and sub base plate 914 against the atmospheric pressure they would be exposed to. This wall 905 would also provide structure for mounting motors, feedback positioning, cooling and other services.

Figure 9B:
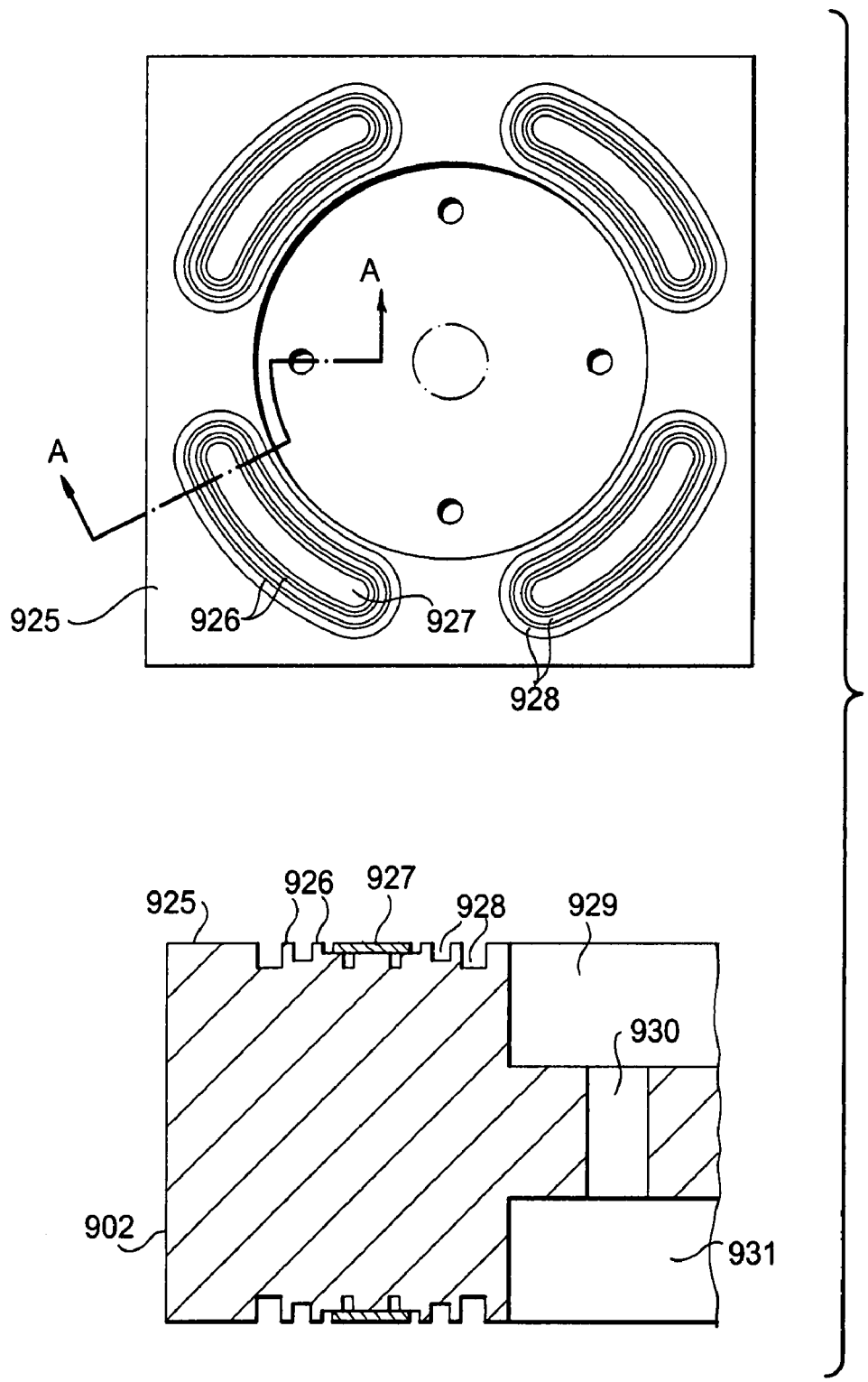
Figure 9C:
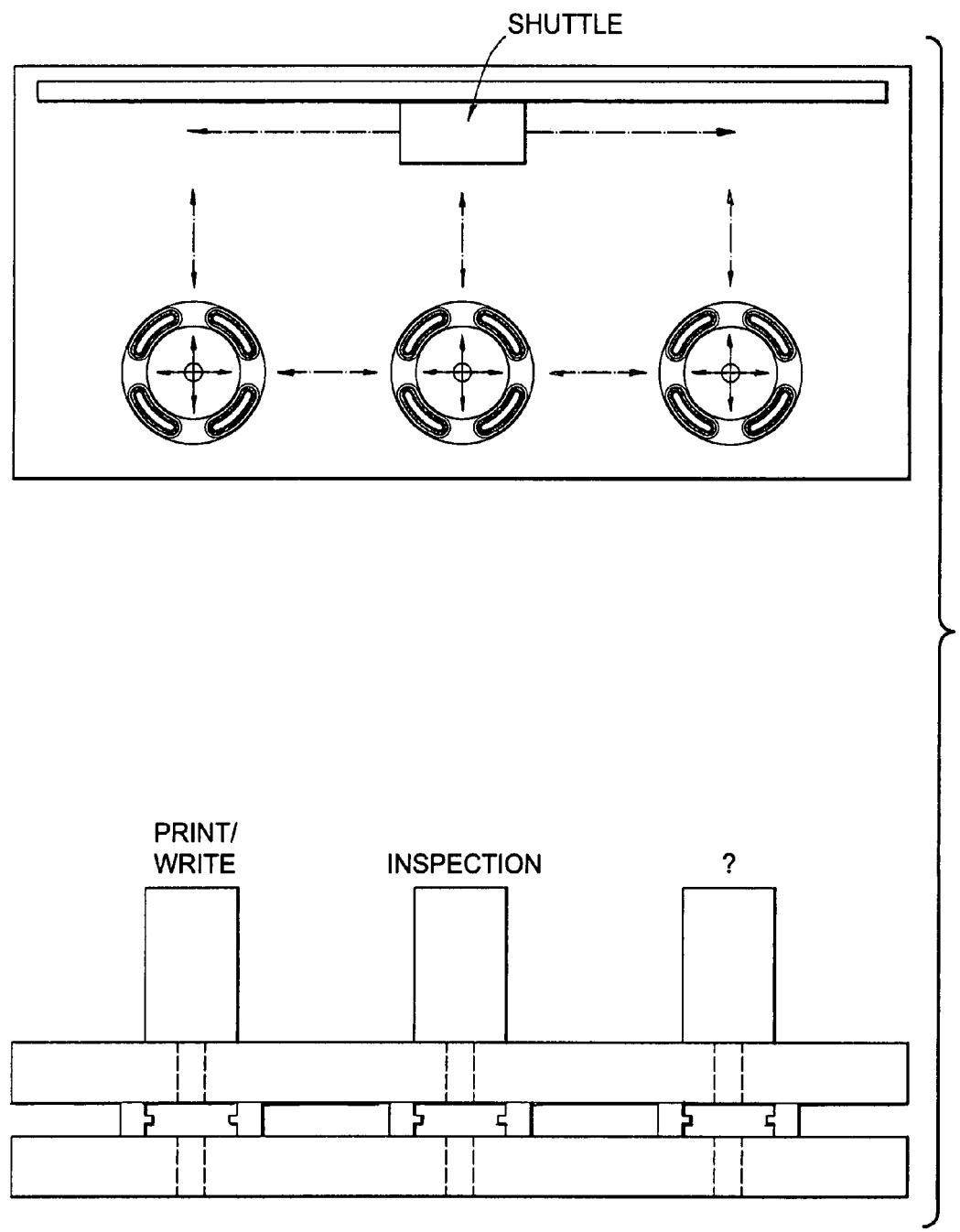

A shuttle system 903 can be 'handed' a stage 902 by the XY motion system 905, 906. The shuttle 903 may then translate the stage 902 with functionality switching the stage 902 from one XY system and process to another. The machine may have only two or three stages as in FIG. 9C or it may have five or more XY systems and processes. There must be conductance between the top side of the stage 902 vacuum volume 929 and the volume 931 on the underside of the stage 902. as shown in figure 9B, the holes 930 provides some conductance although more conductance may be employed as shown in FIG. 9C.

Figure 10:
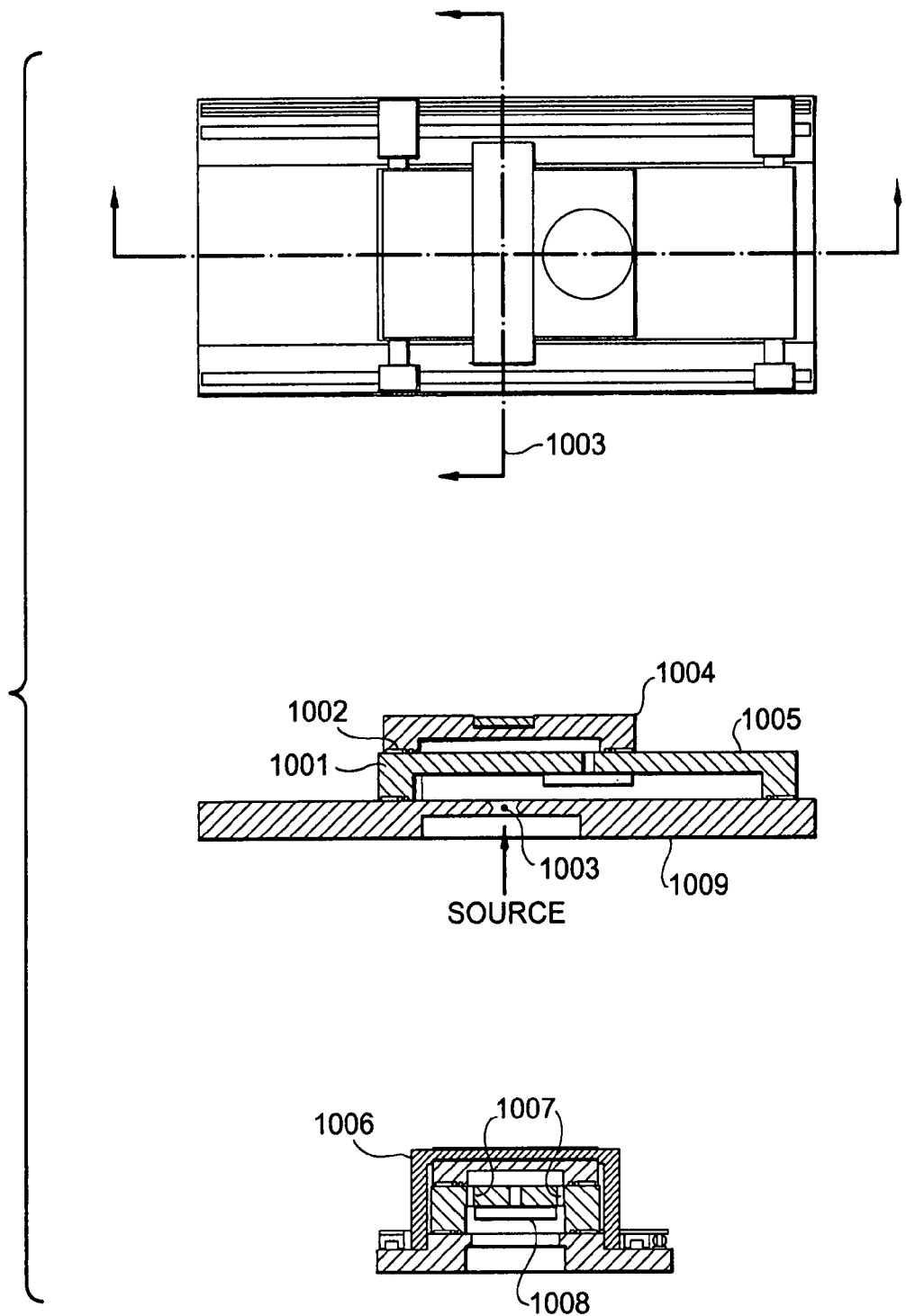
FIG. 10 shows a fifth preferred embodiment of the present invention.

FIG. 10 illustrates a new embodiment allowing for large aperture pumping from behind the wafer as it scans through a beam. The very consistent pumping from the same place behind the wafer through the whole scan allows for very clean and consistent control of the burst field from the implantation of the substrate surface. The pivotable base reference member 1009 provides the reference surface for the motion of a moving vacuum stage 1001. The back of the moving vacuum stage 1005 is also a reference surfaces for stationary plenum 1004 which would be connected to deep pumping power. This pumping power is conducted to the moving vacuum stage 1005 through large apertures 1007 in the back of the moving vacuum stage 1005 which are sealed by the air bearing and differentially pumped grooves 1002 in the stationary plenum 1004 as described in previous embodiments. The base reference member 1009 may be tilted about axis line 1003 and the wafer/chuck 1008 may be rotated for effective implantation of the sides of vias and trenches in the substrate.

While preferred embodiments have been set forth in detail above, those skilled in the art who have received the present disclosure will readily appreciate that other embodiments can be realized within the scope of the invention. For example, the invention can be used in a variety of applications other than those set forth in detail, such as display screens and MEMS. Therefore, the present invention should be construed as limited only by the appended claims.

What is claimed is:

1. An apparatus for forming a vacuum chamber in which an object is placed, the apparatus comprising:
    a first reference member having a first reference surface defined thereon;
    a second reference member having a second reference surface defined thereon and substantially parallel with first reference surface;
    one or more main stages that move between the first and second reference surfaces, said one or more main stages having recessed pockets on both sides with conductance between them, at least one of the recessed pockets for holding the object; and
    a combination fluid and vacuum bearing, comprising a plurality of bearing lands and having a plurality of differentially pumped grooves on said both sides of the one or more main stages that permit motion of the stage between the reference surfaces and surround the bearing lands, thus forming the vacuum chamber between the reference surfaces;
    wherein the second reference member has an aperture defined therein, the aperture in the second reference member being open to the second reference surface and to one of the recessed pockets, for connection to a source of vacuum.

2. An apparatus as in claim 1, wherein the first reference member has an aperture defined therein, the aperture in the first reference member being open to the first reference surface and to another one of the recessed pockets, for connection to a device for processing or inspecting the object while the object is disposed in said another one of the recessed pockets.

3. An apparatus as in claim 2, further comprising actuators in said another one of the recessed pockets for planarization and fine Z-axis motion of the object.

4. An apparatus as in claim 2, wherein the second reference member is below the first reference member.

5. An apparatus as in claim 2, wherein said first and second reference surfaces define an outside vacuum chamber that encloses the one or more stages.

6. An apparatus as in claim 2, wherein said one or more main stages are rotatable.

7. An apparatus as in claim 2, wherein said one or more main stages are laterally movable parallel to the first and second reference surfaces.

8. An apparatus as in claim 7, having a plurality of the apertures in the second reference member and a corresponding plurality of the apertures in the first reference member to define a plurality of processing locations.

9. An apparatus as in claim 8, wherein the first and second reference members are tiltable together.

10. An apparatus as in claim 8, wherein the bearing has gaps between the bearing lands to allow the one or more main stages to pass over the plurality of apertures in the second reference member without disrupting a vacuum in the plurality of apertures in the second reference member.

11. A method for forming a vacuum chamber in which an object is placed, the method comprising:

(a) providing an apparatus comprising:
 a first reference member having a first reference surface defined thereon;
 a second reference member having a second reference surface defined thereon and substantially parallel with first reference surface;
 one or more main stages that move between the first and second reference surfaces, said one or more main stages having recessed pockets on both sides with conductance between them; and
 a combination fluid and vacuum bearing, comprising a plurality of bearing lands and having a plurality of differentially pumped grooves on said both sides of the one or more main stages that permit motion of the stage between the reference surfaces and surround the bearing lands, thus forming the vacuum chamber between the reference surfaces;
 wherein the second reference member has an aperture defined therein, the aperture in the second reference member being open to the second reference surface and to one of the recessed pockets, for connection to a source of vacuum;

(b) using the source of vacuum to form a vacuum in the vacuum chamber; and (c) disposing the object in one of the recessed pockets.

12. A method as in claim 11, wherein the first reference member has an aperture defined therein, the aperture in the first reference member being open to the first reference surface and to another one of the recessed pockets, for connection to a device for processing or inspecting the object while the object is disposed in said another one of the recessed pockets, and wherein the method further comprises processing or inspecting the object.

13. A method as in claim 12, wherein the apparatus further comprises actuators in said another one of the recessed pockets for planarization and fine Z-axis motion of the object, and wherein the method further comprises planarizing or fine Z-axis moving the object using the actuators.

14. A method as in claim 12, wherein the second reference member is below the first reference member.

15. A method as in claim 12, wherein said first and second reference surfaces define an outside vacuum chamber that encloses the one or more stages.

16. A method as in claim 12, wherein said one or more main stages are rotatable.

17. A method as in claim 12, wherein said one or more main stages are laterally movable parallel to the first and second reference surfaces.

18. A method as in claim 17, having a plurality of the apertures in the second reference member and a corresponding plurality of the apertures in the first reference member to define a plurality of processing locations.

19. A method as in claim 18, further comprising tilting the first and second reference members together.

20. A method as in claim 18, wherein the bearing has gaps between the bearing lands to allow the one or more main stages to pass over the plurality of apertures in the second reference member without disrupting a vacuum in the plurality of apertures in the second reference member.

* * * * *